United States Patent
Tanomura (10) Patent No.: US 10,862,433 B2
(45) Date of Patent: Dec. 8, 2020

(54) SEMICONDUCTOR DEVICE AND AMPLIFIER ASSEMBLY

(71) Applicant: Sumitomo Electric Industries, Ltd., Osaka (JP)

(72) Inventor: Masahiro Tanomura, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 100 days.

(21) Appl. No.: 16/188,580

(22) Filed: Nov. 13, 2018

(65) Prior Publication Data

US 2019/0149098 A1 May 16, 2019

(30) Foreign Application Priority Data

Nov. 13, 2017 (JP) ................. 2017-218488

(51) Int. Cl.
*H03F 1/02* (2006.01)
*H03F 3/60* (2006.01)
*H01L 23/00* (2006.01)
*H01L 23/66* (2006.01)
*H01L 23/52* (2006.01)

(52) U.S. Cl.
CPC .......... *H03F 1/0288* (2013.01); *H01L 23/52* (2013.01); *H01L 23/66* (2013.01); *H01L 24/02* (2013.01); *H01L 24/05* (2013.01); *H01L 24/06* (2013.01); *H01L 24/17* (2013.01); *H03F 3/602* (2013.01); *H01L 24/14* (2013.01); *H01L 24/16* (2013.01); *H01L 2223/6683* (2013.01); *H01L 2224/02379* (2013.01); *H01L 2224/0401* (2013.01); *H01L 2224/05008* (2013.01); *H01L 2224/05012* (2013.01); *H01L 2224/05569* (2013.01); *H01L 2224/06051* (2013.01); *H01L 2224/1411* (2013.01); *H01L 2224/14131* (2013.01); *H01L 2224/16227* (2013.01); *H01L 2224/17107* (2013.01); *H01L 2924/1423* (2013.01); *H03F 2200/451* (2013.01)

(58) Field of Classification Search
CPC ..................................... H03F 1/0288
See application file for complete search history.

(56) References Cited

U.S. PATENT DOCUMENTS

| 2003/0201833 | A1 | 10/2003 | Pengelly et al. |
| 2005/0231286 | A1 | 10/2005 | Gotou et al. |
| 2010/0045385 | A1* | 2/2010 | Pengelly ............... H03F 1/0266 330/295 |

(Continued)

FOREIGN PATENT DOCUMENTS

| JP | 2005-303771 A | 10/2005 |
| JP | 2006-525749 A | 11/2006 |

(Continued)

*Primary Examiner* — Patricia T Nguyen
(74) *Attorney, Agent, or Firm* — Baker Botts L.L.P.; Michael A. Sartori (57) ABSTRACT

A semiconductor device and an amplifier assembly implementing the semiconductor device are disclosed. The semiconductor device, which is a type of Doherty amplifier, includes first transistor elements for a carrier amplifier of the Doherty amplifier and second transistor elements for a peak amplifier. A feature of the Doherty amplifier is that the first transistor elements and the second transistor elements are disposed alternatively on a common semiconductor substrate.

3 Claims, 8 Drawing Sheets

(56) References Cited

U.S. PATENT DOCUMENTS

| | | | |
|---|---|---|---|
| 2015/0170986 A1 | 6/2015 | Szymanowski et al. | |
| 2017/0179898 A1* | 6/2017 | Hayes | H03F 1/0216 |
| 2018/0006614 A1* | 1/2018 | Hoogzaad | H01L 21/823437 |
| 2018/0061785 A1* | 3/2018 | Peyrot | H03F 1/0205 |
| 2018/0175802 A1* | 6/2018 | Wu | H01L 23/66 |

FOREIGN PATENT DOCUMENTS

| | | |
|---|---|---|
| JP | 2007-274181 A | 10/2007 |
| JP | 2015-115960 A | 6/2015 |
| WO | 2004-100215 A2 | 11/2004 |

\* cited by examiner

SEMICONDUCTOR DEVICE AND AMPLIFIER ASSEMBLY

CROSS REFERENCE TO RELATED APPLICATION

The present application claims priority benefit of Japanese Patent Application JP2017-218488 filed on Nov. 13, 2017, the disclosure of which is hereby incorporated by reference in its entirety.

BACKGROUND OF INVENTION

1. Field of Invention

The present invention relates to a semiconductor device and an amplifier assembly implementing the semiconductor device.

2. Related Background Arts

International Patent Application published as WO2004/100215 has disclosed a power amplifier of a type of Doherty amplifier that includes a carrier amplifier and a peak amplifier, where the carrier amplifier linearly operates for an input radio frequency (RF) signal, while, the peak amplifier operates after the carrier amplifier saturates. The power amplifier disclosed therein includes additional peak amplifiers to enhance a maximum output power thereof.

Another prior patent document laid open No. JP2005-303771A has disclosed a power amplifier of a type of Doherty amplifier. The power amplifier disclosed therein provides a circuit in an output terminal of a field effect transistor (FET) comprising the carrier amplifier, where the circuit reflects higher harmonics contained in an output signal from the FET. Specifically, the circuit may be operable as a short circuit, or show enough low impedance, against a ground for even harmonics; while, may be operable as an open circuit, or show enough high impedance, against the ground for odd harmonics. Another FET comprising the peak amplifier accompanies a circuit that also reflects higher harmonics contained in the output RF signal of the FET. The circuit may operate as an open circuit, or show enough high impedance, against the ground for even harmonics; while, operate as a short circuit, or show enough low impedance, against the ground for odd harmonics.

Still another Japanese patent document laid open No. JP2015-115960A has also disclosed a Doherty amplifier enclosed within a package that provides a ground plane, on which a carrier amplifier and a peak amplifier are mounted in side by side with a shielding wall therebetween. The shielding wall may reduce coupling between the carrier amplifier and the peak amplifier.

Still another Japanese patent document laid open No. JP2007-274181A has disclosed a semiconductor apparatus providing a plurality of semiconductor devices disposed in zigzag pattern to dissipate heat generated in the semiconductor devices.

Improvement of efficiency in an amplifier has been continuously desired in a communication system from a viewpoint of low cost, that is, the improvement in the efficiency enables to save power consumption not only in the amplifier itself but in the cooling system for the amplifier. One technique to save the power consumption is, what is called, a Doherty amplifier that includes a carrier amplifier operating linearly for an input signal and a peak amplifier operating only after the carrier amplifier saturates. A Doherty amplifier may enhance the efficiency not only at maximum output power but at medium output power.

A recent communication system sets the frequency band thereof in a millimeter wavelength as an increase of transmission capacity. An amplifier operable in such a high frequency range inevitably increases power consumption thereof. Because a Doherty amplifier operates a peak amplifier only in a high input power; a carrier amplifier that is always active independent of the input power becomes exposed in high temperatures.

SUMMARY OF INVENTION

An aspect of the present invention relates to a semiconductor device type of Doherty amplifier that amplifies a radio frequency (RF) signal. The semiconductor device includes a plurality of first transistor elements collectively operating as a carrier amplifier of the Doherty amplifier, and a plurality of second transistor elements collectively operating as a peak amplifier of the Doherty amplifier. A feature of the semiconductor device is that the first transistor elements and the second transistor elements are disposed alternatively to each other on a common semiconductor substrate.

Another aspect of the present invention relates to an amplifier assembly for amplifying a RF signal. The amplifier assembly includes a semiconductor device and an assembly substrate that mounts the semiconductor device in face down arrangement through solder bumps. A feature of the amplifier assembly is that the first and second transistor elements are disposed alternatively on a semiconductor substrate common to the first transistor elements and the second transistor elements.

BRIEF DESCRIPTION OF THE DRAWINGS

The foregoing and other aspects of exemplary embodiments are made more evident in the following Detailed Description, when read in conjunction with the attached Drawing Figures, wherein.

DESCRIPTION OF EMBODIMENTS

Next, an embodiment according to the present invention will be described as referring to drawings. However, the present invention is not restricted to the embodiment and has a scope defined in claims attached and all modifications and changed of elements within the claims and equivalent thereto. In the description of the drawings, numerals or symbols same with or similar to each other will refer to elements same with or similar to each other without duplicating explanations.

Figure 1:
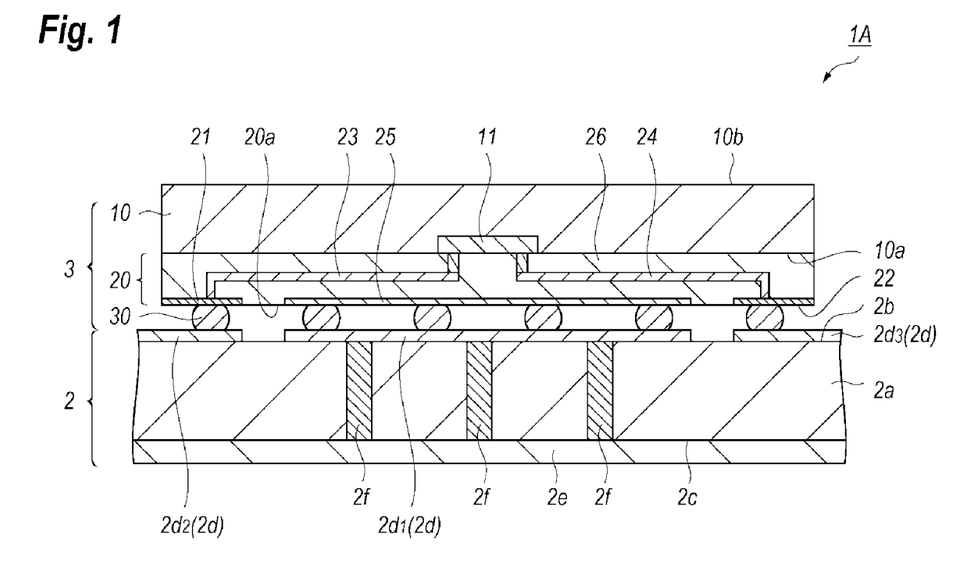
FIG. 1 is a side cross sectional view of an amplifier apparatus according to embodiment.

FIG. 1 is a cross sectional view of an amplifier assembly 1A of an embodiment of the present invention. The amplifier assembly 1A shown in FIG. 1 provides an assembly substrate 2 and a semiconductor device 3 mounted on the assembly substrate 2. The assembly substrate 2 includes a base 2a of a square slab made of insulating material, wirings 2d on a top surface 2b of the base 2a, and a back metal 2e on a whole back surface 2c of the base 2a. The wirings 2d, which faces the semiconductor device 3, includes a ground pad $2d_1$ and signal lines, $2d_2$ and $2d_3$, where the ground pad $2d_1$ is electrically connected with the back metal 2e through vias 2f that pierce the base 2a. The back metal 2e secures the ground GND. The signal line $2d_2$, which may be a transmission line, carries a radio frequency (RF) signal into the semiconductor device 3, while the other signal line $2d_3$, which may be also a transmission line, carries the RF signal amplifier by the semiconductor device 3.

The semiconductor device 3, which may be a type of microwave monolithic integrated circuit (MMIC) of a Doherty amplifier, is mounted on the assembly substrate 2 in face down arrangement by, what is called, the flip-chip bonding. The semiconductor device 3 includes a semiconductor substrate 10, a wiring layer 20, and some bumps 30. The semiconductor substrate 10 has a slab shape providing a top surface 10a and a back surface 10b, where the top surface 10a in a center thereof provides an active region 11 including a plurality of transistor elements. The wiring layer 20, which is provided on a whole top surface 10a, includes an input terminal 21, an output terminal 22, an input line 23, output line 24, and a ground metal 25. Those terminals, lines, and the ground are formed by metal films buried within the insulating film 26 and on a surface thereof.

The input terminals 21, which is electrically connected with the signal line $2d_2$ on the assembly substrate 2, carries a radio frequency (RF) signal from the signal line $2d_2$. For instance, the input terminal 21, which is a topmost layer in the wiring layer 20, is exposed from the insulating film 26 at the top surface 20a thereof. Also, the input terminal 21 is electrically connected with the signal line $2d_2$ in the assembly substrate 2 through one of the bumps 30. The output terminals 22 is connected with the signal line $2d_3$ in the assembly substrate 2. Specifically, the output terminal 22, which is provided in topmost in the wiring layer 20, is exposed from the insulating film 26 at the surface 20a of the wiring layer 20. Also, the output terminal 22, which is connected with the signal line $2d_3$ in the assembly substrate 2 through another one of the bumps 30, carries the amplified RF signal on the signal line $2d_3$. The ground metal 25, which is also provided in topmost in the wiring substrate 20, exposed from the insulating film 26 at the top surface 20a of the wiring layer 20. The ground metal 25 is connected with the ground pad $2d_1$ in the assembly substrate 2 through the bumps 30.

Figure 2:
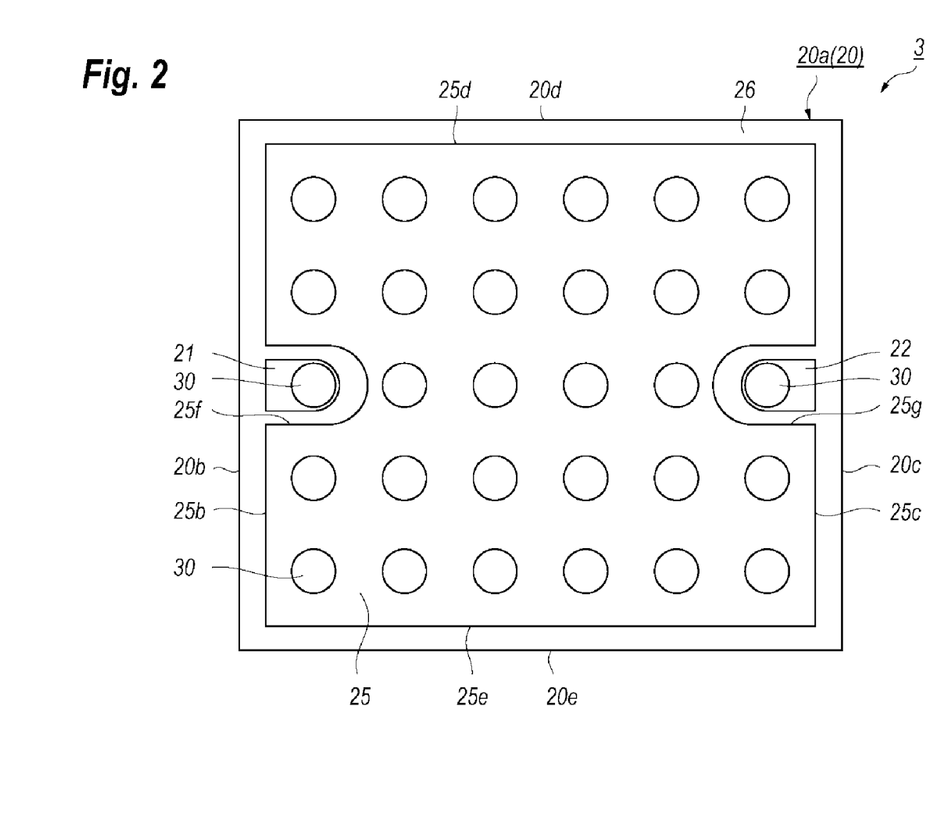
FIG. 2 is a plan view showing a top surface of a wiring layer in the amplifier apparatus.

FIG. 2 is a plan view showing the top surface 20a of the wiring layer 20. The semiconductor device 3 of the present embodiment, as shown in FIG. 2, has a rectangular plane shape including sides, 20b and 20c, facing to each other and other sides, 20d and 20e, also facing to each other, where the sides, 20b to 20e, may form the rectangular plane shape of the semiconductor device 3. Thus, the former pair of the sides, 20b and 20c, extend perpendicular to the later pair of sides, 20d and 20e.

The input terminal 21 is disposed closer to the side 20b and in a center of the side 20b between the two sides, 20d and 20e. The output terminal 22 is disposed closer to the side 20c and in a center thereof between the two sides, 20d and 20e. The ground metal 25 covers almost a whole of the top surface 20a of the wiring layer 20 except for the input terminal 21 and the output terminal 22. The ground metal 25 provides four edges, 25b to 25e, each extending along the sides, 20b to 20e, where the edges, 25b and 25c, along the sides, 20b and 20c, provide respective cuts, 25f and 25g, in a center thereof within which the input terminal 21 and the output terminal are disposed.

The input terminal 21 and the output terminal 22 provide respective bumps 30 thereon; while, the ground metal 25 provides many bumps 30 thereon. Those bumps 30 are disposed in a square array on the top surface 20a of the wiring layer 20.

Figure 3A:
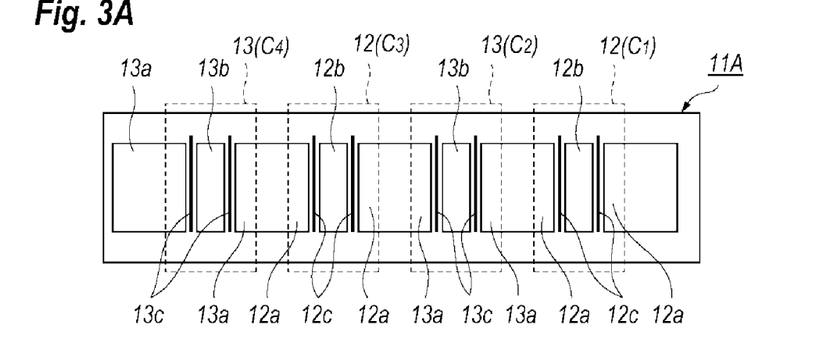
FIG. 3A is a plan view showing an example of an active region.
Figure 3B:
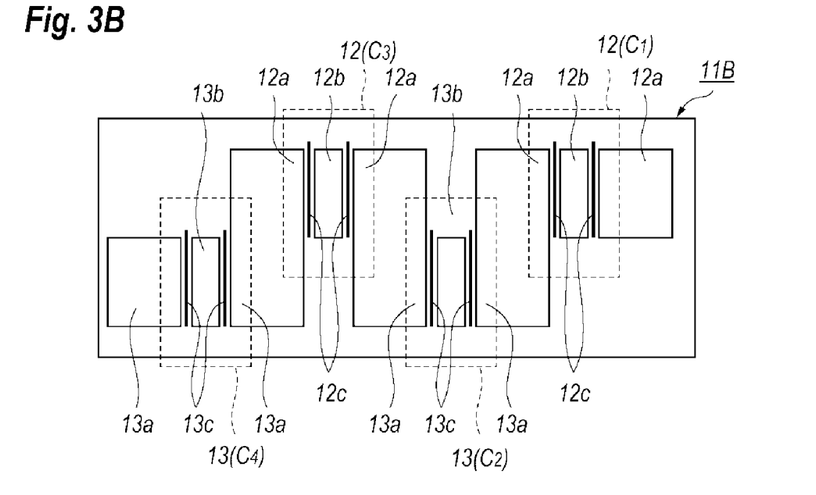
FIG. 3B is also a plan view showing another example of the active region.

FIG. 3A is a plan view showing an example of an active region 11A, while, FIG. 3B is also a plan view showing another example of the active region 11B. The active regions, 11A and 11B, includes first transistor elements 12 and second transistor elements 13, where the active regions, 11A and 11B, shown in FIG. 3A and FIG. 3B, include two first transistor elements 12 and two second transistor elements 13. Those transistor elements, 12 and 13, which are formed on a semiconductor substrate 10 common to the elements, 12 and 13, are hermetically enclosed within a package. The active regions, 11A and 11B, for the transistor elements, 12 and 13, may be continuously formed on the substrate 10.

The semiconductor device 3 of the present embodiment, as already described, has the type of Doherty amplifier, where the first transistor elements 12 may be operable as a carrier amplifier (CA), while the second transistor elements 13 may be operable as a peak amplifier (PA) that become active after the carrier amplifier saturates in an output thereof. The second transistor elements 13 receive a gate bias externally to operate the peak amplifier in the B-class and/or the C-class.

The first transistor elements 12 and the second transistor elements 13 are disposed alternatively in an array along a longitudinal direction of the active region 11A in an example shown in FIG. 3A; while, the first and second transistor elements, 12 and 13, are also disposed alternatively but in a zigzag pattern in the arrangement shown in FIG. 3B. That is, in the disposition shown in FIG. 3B, the first transistor elements 12 are disposed in an array along an axis and the second transistor elements 13 are also disposed in an array but along another axis offset from and in parallel to the former axis.

The first transistor elements 12 each include a pair of source electrodes 12a, a drain electrode 12b disposed between the source electrodes 12a, and a pair of gate electrodes 12c disposed between the respective source electrodes 12a and the drain electrode 12b. Those electrodes, 12a to 12c, extend along the lateral direction of the active region 11A, that is, those electrodes have respective rectangular shapes with longitudinal axes extending in parallel to the lateral direction of the active region 11A. Also, the second transistor elements 13 each provide a pair of source electrodes 13a, a drain electrode 13b disposed between the source electrodes 13 and a gate electrode 13c disposed between the respective source electrode 13a and the drain electrode 13b. Those electrodes, 13a to 13c, have respective rectangular shapes with longitudinal sides thereof extending in parallel to the lateral direction of the active region 11A. The source electrodes, 12a and 13a, are commonly owned by the first and second transistor elements, 12 and 13.

Figure 4:
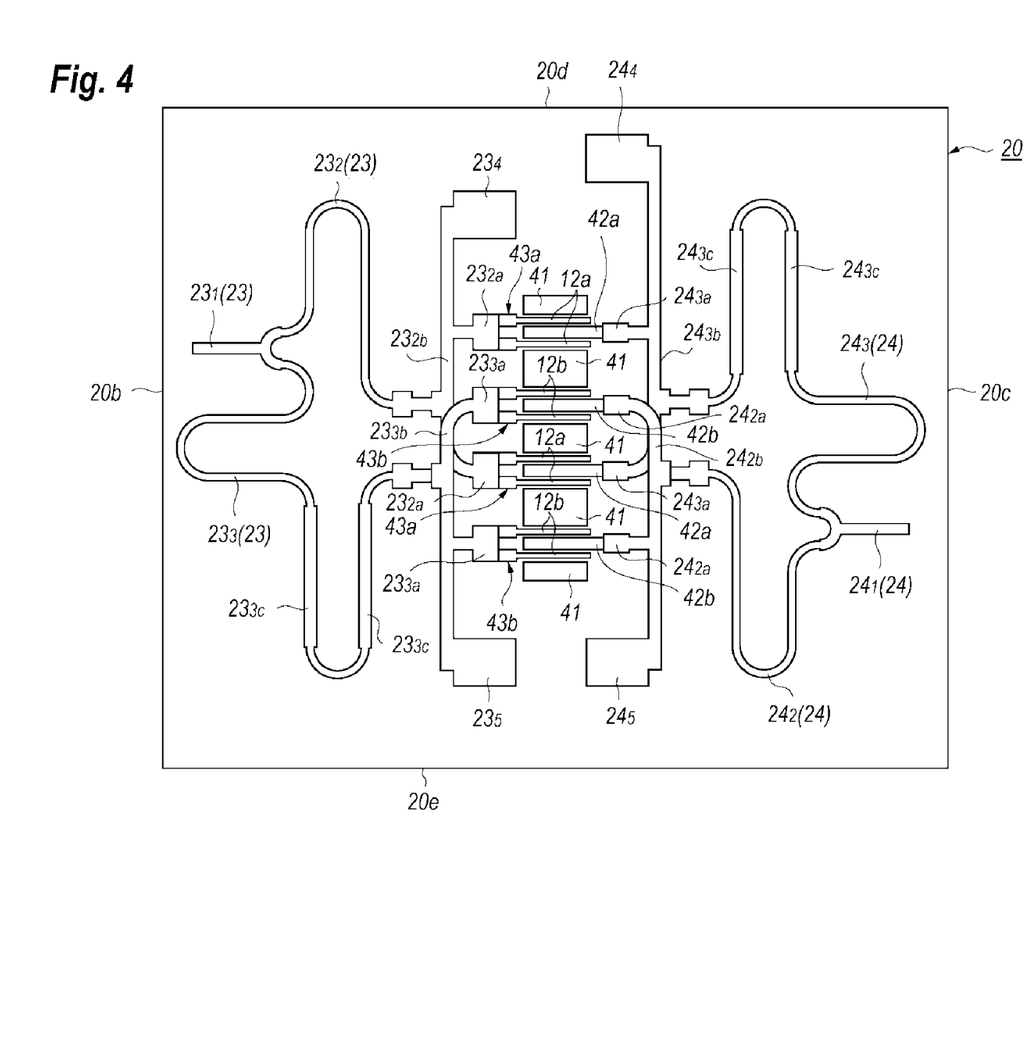
FIG. 4 is a plan view of a wiring layer.
Figure 5:
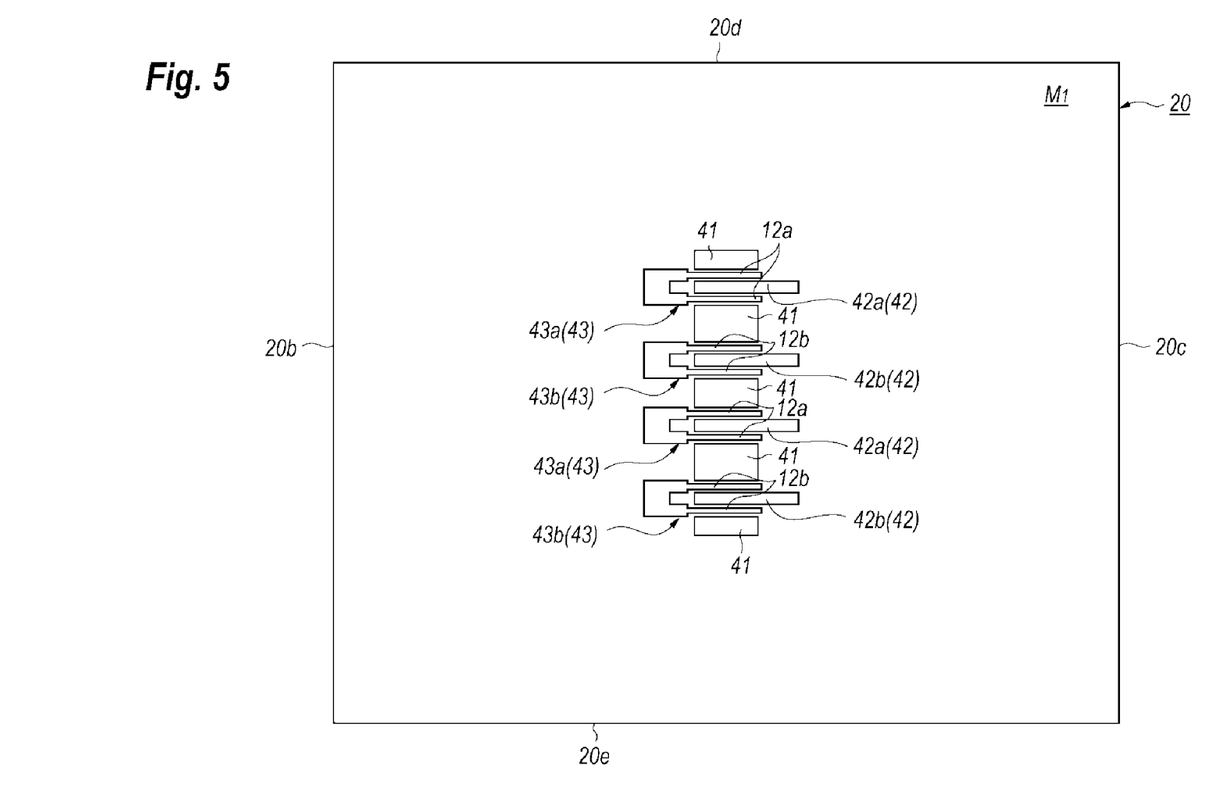
FIG. 5 is a plan view of a first wiring layer involved in the wiring layer.
Figure 6:
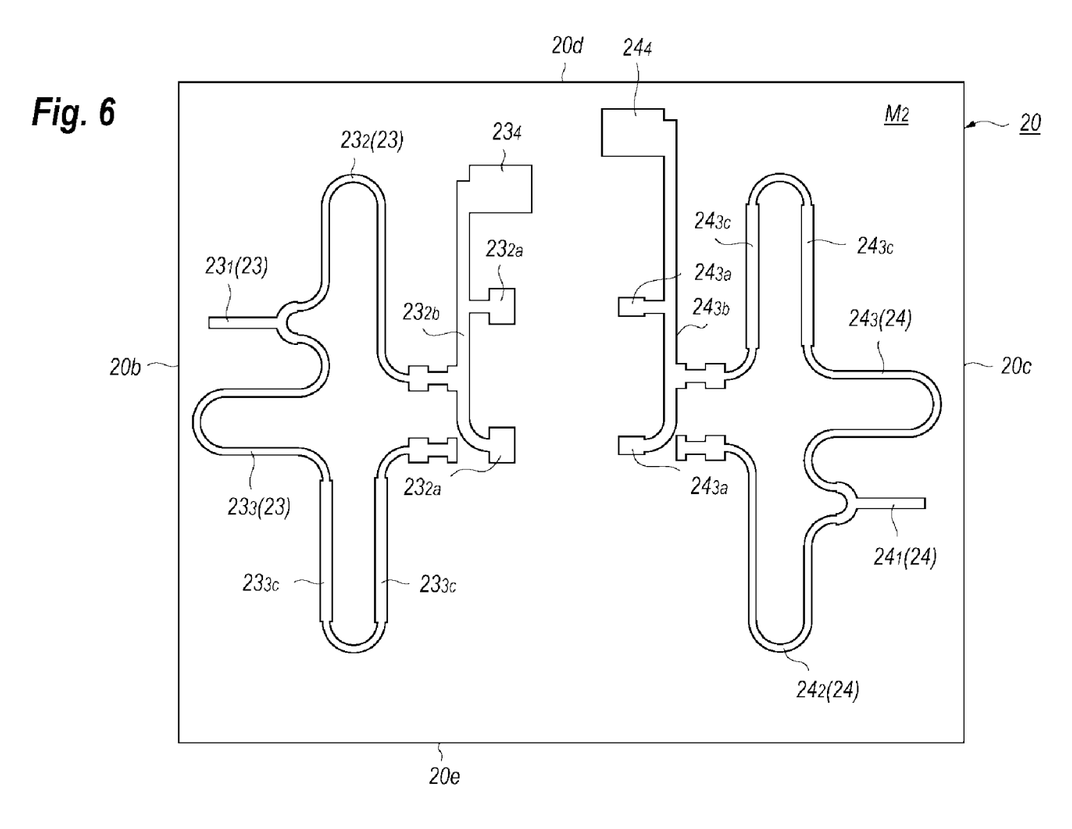
FIG. 6 is a plan view of a second wiring layer involved in the wiring layer.
Figure 7:
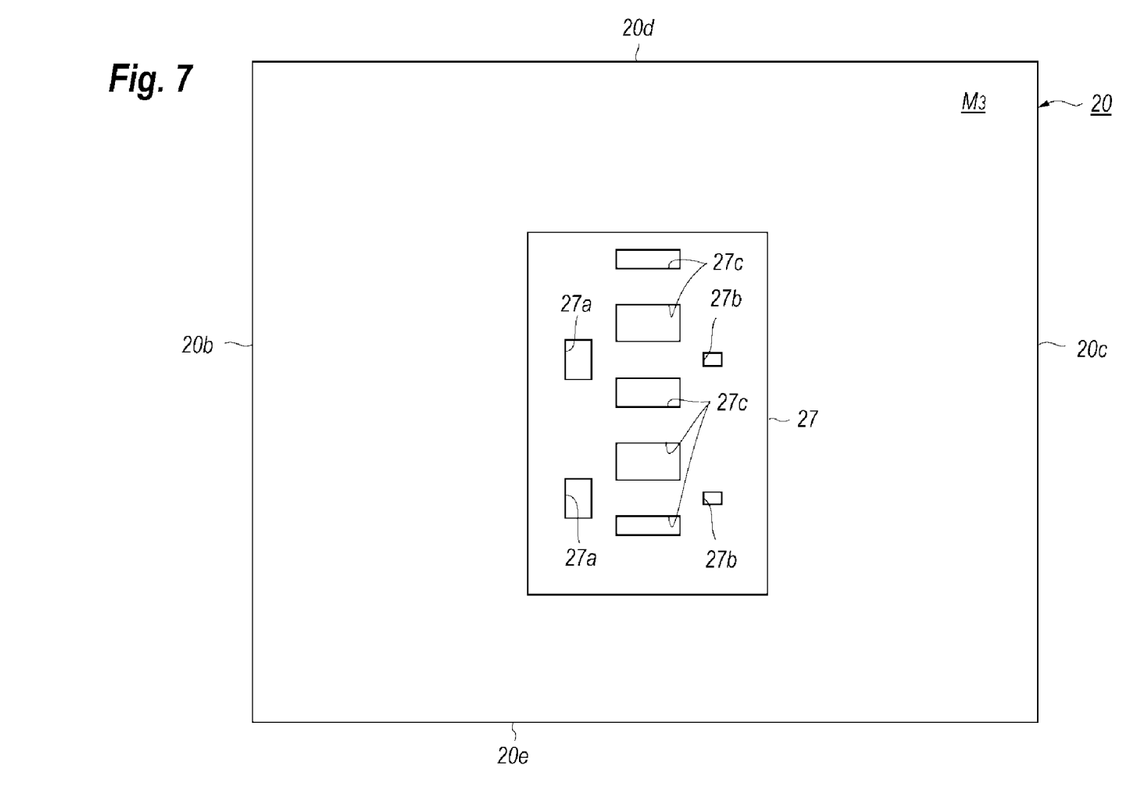
FIG. 7 is a plan view of a third wiring layer involved in the wiring layer.
Figure 8:
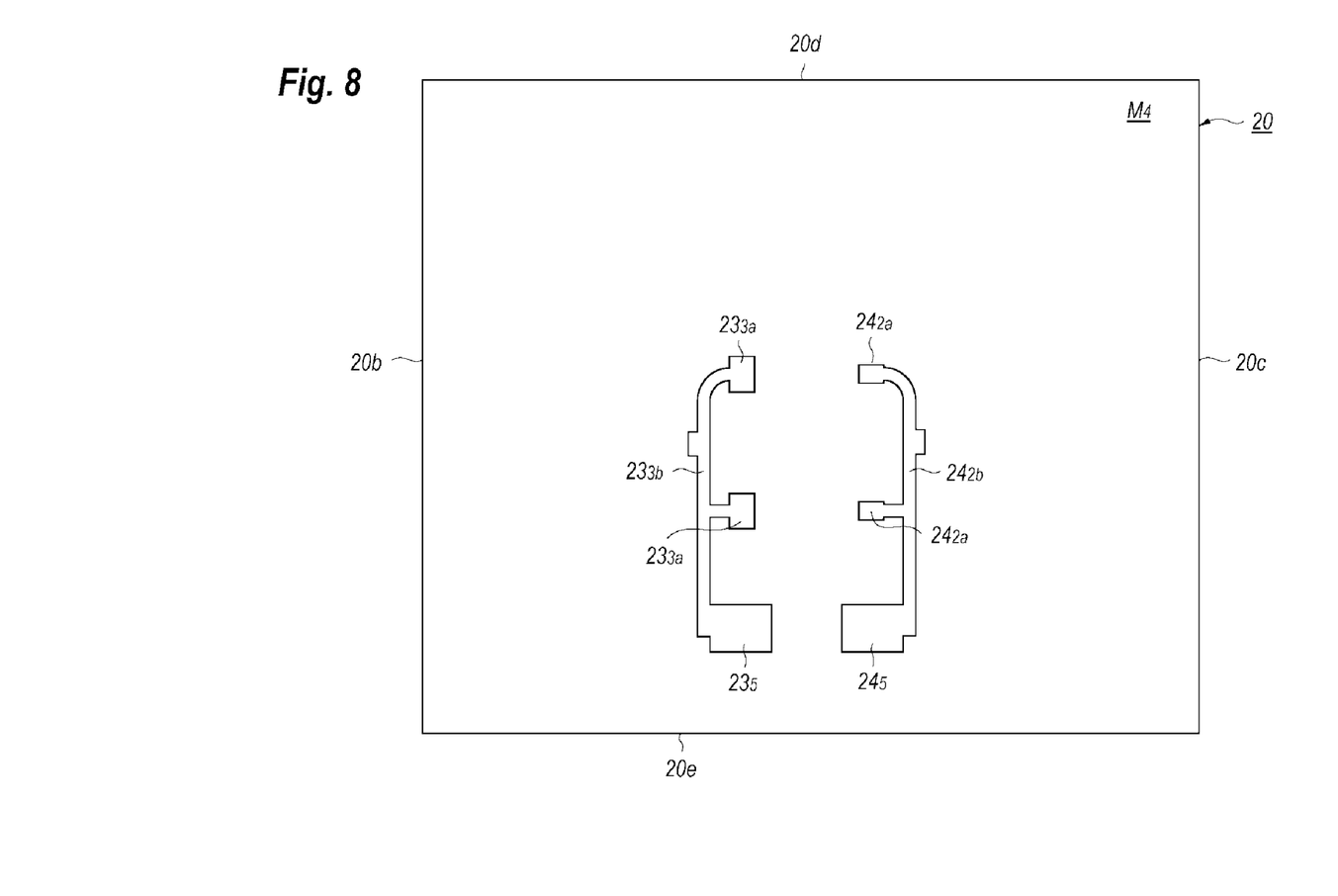
FIG. 8 is a plan view of a fourth wiring layer involved in the wiring layer.

Next, details of the wiring layer 20 will be described referring to FIG. 4 to FIG. 8, where FIG. 4 is a plan view showing an inner arrangement within the wiring layer 20 by removing the insulating film 26 and FIG. 5 to FIG. 8 show respective metal layers, $M_1$ to $M_4$; that is, FIG. 5 is a plan view showing a first metal layer $M_1$ closest to the semiconductor substrate 10, FIG. 6 is a plan view of a second metal layer $M_2$ provided on the first metal layer $M_1$, FIG. 7 is a plan view of a third metal layer $M_3$ provided on the second metal layer $M_2$, and FIG. 8 is a plan view of a fourth metal layer $M_4$ provided on the third metal layer $M_3$, where the metal layers, $M_1$ to $M_4$, are buried within the insulating film 26; while, the input terminal 21, the output terminal 22, and the ground metal 25 are disposed on a top metal layer and exposed from the insulating film 26. Provided between the metal layers, $M_1$ to $M_4$, is the insulating film 26 to electrical isolate the metal layers, $M_1$ to $M_4$.

The wiring layer 20, as shown in FIG. 4, includes some source interconnections 41, some drain interconnections 42, and some gate interconnections 43, where the present embodiment includes respective four interconnections, 41 to 43. The first metal layer $M_1$ includes those interconnections, 41 to 43. Specifically, the source interconnections 41 cover and in contact with the source electrodes, 12a and 13a. Some of the drain interconnections 42a cover and in contact with the drain electrodes 12b in the first transistor element 12, namely, the carrier amplifier; while, rest of the drain interconnections 42b cover and in contact with the drain electrodes 13b in the second transistor element 13, namely, the peak amplifier. Those drain interconnections, 42a and 42b, extend toward the output terminal 22 from the respective transistor elements, 12 and 13.

Some of gate interconnections 43a are extended from the gate electrodes 12c of the first transistor elements 12 which extend between the drain interconnection 42a and the respective source interconnections 41. Rest of the gate interconnections 43b extend from the gate electrodes 13c of the second transistor elements 13. The gate electrodes 13c extend between the drain interconnection 42b and the respective source interconnections 41.

The input line 23 includes a first input line $23_1$ extending from the input terminal 21 and second and third input lines, $23_2$ and $23_3$, split from the first input line $23_1$. The RF signal input to the input terminal 21 is evenly split in power thereof into the second and third input lines, $23_2$ and $23_3$. The second input line $23_2$ connected with the gate interconnections 43a for the first transistor elements 12; while, the third input line $23_3$ is connected with the other gate interconnection 43b of the second transistor elements 13.

The second input line $23_2$ has a U-shaped portion protruding toward the side 20d of the wiring layer 20 where the U-shaped portion shows an inductive component to convert input impedance for the first transistor elements 12. The second input line $23_2$ in one end thereof opposite to an end connected with the first input line $23_1$ provides a splitter $23_{2b}$ to split the RF signal to the respective gate interconnections 43a of the first transistor elements 12 through metal patterns $23_{2a}$. Also, the second input line $23_2$ receives a gate bias from the input bias line $23_4$ extended from the splitter $23_{2b}$.

The third input line $23_3$ also provides an U-shaped portion protruding toward the side 20b to secure an inductive component to convert the input impedance for the second transistor elements 13, where the U-shaped portion in the third input line $23_3$ has dimensions substantially same with dimensions of the U-shape portion in the second input line $23_2$. That is, two U-shaped portions causes substantially same inductive components for the first and second transistor elements, 12 and 13, because the first and second transistor elements, 12 and 13, also have the dimensions same with each other.

However, the third input line $23_3$ provides an additional U-shaped portion $23_{2c}$ with a length corresponding to a quarter wavelength $\lambda/4$ of the input RF signal. The additional U-shaped portion $23_{2c}$ protrudes toward the side 20e and has a width slightly greater than a width in rests of the third input line $23_3$.

The third input line $23_3$ in one end thereof opposite to an end connected with the first input line $23_1$ and the second input line $23_2$ provides a splitter $23_{3b}$ that further splits the RF signal split from the first input line $23_1$ into the respective second transistor elements 13. The RF signals split twice are provided to the gate interconnections 43b through respective metal patterns $23_{3a}$. The splitter $23_{3b}$ also connects another input bias line $23_5$ in another end opposite to an end connected with the metal patterns $23_{3a}$. In order to operate the third transistor elements 13 as the peak amplifier, the gate bias supplied in the input bias line $23_5$ is different from the gate bias for the first transistor elements 12 supplied in the other input bias line $23_4$, where the former gate bias for the second transistor elements 13 is generally deeper than the gate bias for the first transistor elements 12 in order to operate the second transistor elements 13 in the B-class, or the C-class.

In the present embodiment, a signal line attributed to the second input line $23_2$ intersects with another signal line attribute to the third input line $23_3$; that is, the former signal line $23_2$ may be formed in one of the wiring layers, $M_1$ to $M_4$; while, the latter signal line may be formed in another wiring layer, $M_1$ to $M_4$, different from the former signal line. For instance, as shown in FIG. 8, the fourth metal layer $M_4$ provides the metal patterns $23_{3b}$ and the input bias line $23_5$; while, the second metal layer $M_2$ provides rest patterns, $23_{3a}$ and $23_{3c}$, of the third input line $23_3$. The metal pattern $23_{3b}$ of the second input line $23_3$ in the fourth metal layer $M_4$ is electrically connected with the rest portions in the third input line $23_3$ formed in the second metal layer $M_2$ through via metals. Also, as shown in FIG. 6, all of the metal patterns in the second input line $23_2$ and the input bias line $23_4$ are formed in the second metal layer $M_2$; while, the metal patterns $23_{3b}$ among the third input line $23_3$, which is formed in the fourth metal layer $M_4$, intersects with the metal pattern $23_{2b}$ in the second input line $23_2$, which is formed in the second metal layer $M_2$, thereby, the gate interconnections, 43a and 43b, which are disposed alternately, are connected with the second input line $23_2$ and the third input line $23_3$, respectively.

The output line 24 includes the first to third output lines, $24_1$ to $24_3$, where the third output line $24_3$ is pulled out from the drain interconnections 42a of the first transistor elements 12, the second output line $24_2$ is pulled out from the drain interconnections 42b of the second transistor elements 13, and the first output line $24_1$ couples the second output line $24_2$ with the third output line $24_3$ and extends to the output terminal 22.

The third output line $24_3$ has a portion with a U-character protruding toward the side 20c to adjust the output impedance of the first transistor elements 12. The third output line $24_3$ in one ends thereof provides metal patterns $24_{3a}$ coupled with the respective drain interconnections 42a, where the metal patterns $24_{3a}$ are collected by the metal pattern $24_{3b}$ that is also connected with the output bias line $24_4$.

The second output line $24_2$ provides a portion with the U-character that protrudes toward the side 20e to secure a substantial length thereof. Because the first and second transistor elements, 12 and 13, have dimensions equal to each other, the first and second transistor elements, 12 and 13, show output impedance substantially equal to each other. Accordingly, the portion with the U-character in the second output line 24$_2$ has a length equal to a length of the portion with the U-character in the third output line 24$_3$.

However, the third output line 24$_3$ further provides another portion with a U-character protruding toward the side 20$d$, which means that the third output line 24$_3$ has a total length longer than a total length of the second output line 24$_2$ by a length of the metal pattern 24$_{3b}$ with a quarter wavelength ($\lambda$/4) of the RF signal subject to the amplifier assembly 1A. The metal pattern 24$_{3c}$ has a plane shape equal to the plane shape of the metal pattern 23$_{3c}$ in the third input line 23$_3$; that is, the metal pattern 24$_{3c}$ has a width slightly wider than widths in rest of the third output line 24$_3$.

The second output line 24$_2$ in one end thereof provides metal patterns 24$_{2a}$ that are coupled with the drain interconnections 42$b$ of the second transistor elements 13. The metal patterns 24$_{2a}$ are collected in the metal pattern 24$_{2b}$ that is connected with the second bias line 24$_5$. Because the amplifier assembly 1A operates the second transistor elements 13 as the peak amplifier, a bias provided to the output bias line 24$_5$ may be different from a bias supplied to the first transistor elements 12 through the output bias line 24$_4$.

In the present embodiment, the second output line 24$_2$ and the third output line 24$_3$ are formed in the respective wiring layer, M$_1$ to M$_4$, different from each other; accordingly, the second output line 24$_2$ may intersect with the third output line 24$_3$. For instance, the forth metal layer M$_4$ provides the metal pattern 24$_{2b}$ in the second output line 24$_2$ and the output bias line 24$_5$ as shown in FIG. 8; while, the second metal layer M$_2$ provides the rest portion of the second output line 24$_2$ as shown in FIG. 6. The metal pattern 24$_{2b}$ in the second output line 24$_2$, which is formed in the fourth metal layer M$_4$, is connected with the rest portion of the second output line 24$_2$ formed in the second metal layer M$_2$ through vias. Also, as shown in FIG. 6, the first output line 24$_1$ and the output bias line 24$_4$ are formed in the second metal layer M$_2$, as shown in FIG. 6. The metal pattern 24$_{2b}$ in the second output line 24$_2$, which is formed in the second metal layer M$_2$, intersects with the metal pattern 24$_{3b}$ in the third output line 24$_3$, thereby the drain interconnections, 42$a$ and 42$b$, that are alternatively disposed may be connected with the third output line 24$_3$ and the second output line 24$_2$, respectively.

The wiring layer 20 further provides the ground layer 27, which is shown in FIG. 7 and formed in the third metal layer M$_3$, which is between the fourth metal layer M$_4$ and the second metal layer M$_2$, where the fourth metal layer M$_4$, as described above, provides the metal pattern 23$_{3b}$ in the third input line 23$_3$ and the metal pattern 24$_{2b}$ in the second output line 24$_2$, while, the second metal layer M$_2$ provides the rest portion in the third input line 23$_3$, the second input line 23$_2$, the rest portion of the second output line 24$_2$, and the third output line 24$_3$. The ground layer 27 in the third wiring layer 27 overlaps with the metal pattern 23$_{3b}$ in the third input line and the metal pattern 24$_{2b}$ in the second output line. The ground layer 27 may be connected with the ground metal 25 through vias.

The ground layer 27 provides openings, 27$a$ and 27$b$, attributed to the second transistor elements 13. Provided within the former openings 27$a$ are vias that connect the metal patters 23$_{3a}$ in the third input line 23$_3$, which is provided in the fourth metal layer M$_4$, with the gate interconnections 43$b$, which is provided in the first metal layer M$_1$. Provided within the latter openings 27$b$ are other vias that connect the metal patterns 24$_{2a}$ in the second output line 24$_2$, which are formed in the fourth metal layer M$_4$, with the drain interconnections 42$b$, which are formed in the first metal layer M$_1$. Moreover, the ground layer 27 may further provides openings 27$c$ corresponding to the source interconnections 41. Provided within the openings 27$c$ are vias that connect the source interconnections 41, which are formed in the first metal layer M$_1$, with the ground metal 25 in the top of the wiring layer 20. Those openings, 27$a$ to 27$c$, are not illustrated in FIG. 7.

Next, advantages realized in the amplifier assembly 1A and the semiconductor device 3 according to the embodiment will be described. In a Doherty amplifier, a carrier amplifier operates linearly with respect to an input RF signal; while a peak amplifier operates after the carrier amplifier saturates. Thus, because only a large input RF signal may activate the peak amplifier, only the carrier amplifier may be active in a medium and/or small input RF signal, which means that only the carrier amplifier generates heat for a small and/or medium input RF signal. Accordingly, when the carrier amplifier and the peak amplifier are disposed side by side, the heat generation of an amplifier at a low and/or small RF input signal causes unbalanced distribution.

The semiconductor device 3 according to the present invention disposes the first transistor elements 12, which constitute the carrier amplifier of a Doherty amplifier, and the second transistor elements 13, which constitute the peak amplifier, alternatively each other. The disposition of those transistor elements, 12 and 13, may widen a span between the first transistor elements 12 as maintaining packing density of the transistor elements, 12 and 13, and may reduce density of heat generation. The second transistor elements 13 for the peak amplifier is substantially inactive at low and medium input power, accordingly, those second transistor elements 13 may cause no influence for the heat dissipation of the first transistor elements 12.

Tables 1 to 3 below show temperature rises of respective transistors, C$_1$ to C$_4$, indicated in FIG. 3A and FIG. 3B. Table 1 shows results in a conventional example where two transistor elements 12 for the carrier amplifier are collectively disposed in side by side as the transistors, C$_3$ and C$_4$, while, two transistor elements 13 for the peak amplifier are collectively disposed in side by side as the transistors, C$_1$ and C$_2$, and the carrier amplifier and the peak amplifier are disposed in side by side. Table 2 corresponds to the disposition shown in FIG. 3A, while, Table 3 corresponds to the disposition shown in FIG. 3B. Table1 to Table 3 below illustrate respective temperature rises from a condition of no RF input signal when only the first transistor elements 12 become active at medium power and both the first and second transistor elements, 12 and 13, are activated at the maximum input power.

TABLE 1

| conventional disposition | | | | |
| --- | --- | --- | --- | --- |
|  | C$_1$ | C$_2$ | C$_3$ | C$_4$ |
| maximum power | 19.0 | 20.9 | 20.9 | 19.0 |
| medium power | — | — | 19.2 | 18.0 |

TABLE 2 disposition shown in FIG. 3A

|  | $C_1$ | $C_2$ | $C_3$ | $C_4$ |
|---|---|---|---|---|
| maximum power | 19.0 | 20.9 | 20.9 | 19.0 |
| medium power | 16.9 | — | 16.9 | — |

TABLE 3 disposition shown in FIG. 3B

|  | $C_1$ | $C_2$ | $C_3$ | $C_4$ |
|---|---|---|---|---|
| maximum power | 18.0 | 19.2 | 19.2 | 18.1 |
| medium power | 16.5 | — | 16.5 | — |

The conventional arrangements shown in Table 1 above raises the temperature of the carrier amplifiers, $C_3$ and $C_4$, by 19.2° C. and 18.0° C., respectively; while, the arrangements according to the present invention suppresses the temperature rises of the carrier amplifier to 16.9° C. shown in Table 2 and 16.5° C. shown in Table 3. Because the arrangement shown in FIG. 3B widens the area for one transistor elements, 12 and 13, the temperature rises of the respective transistor elements, 12 and 13, may be lowered.

A conventional Doherty amplifier has an arrangement where a carrier amplifier and a peak amplifier are independently packaged and disposed in side by side on an assembly substrate. However, a Doherty amplifier to be applied in a millimeter wavelength band, or a sub-millimeter wavelength band, is hard or almost impossible to dispose carrier and peak amplifiers in such a manner because a packaged carrier amplifier and a packaged peak amplifier are necessary to set a substantial space therebetween. Accordingly, a new arrangement is necessary for a Doherty amplifier applicable to a millimeter, or a sub millimeter band, to enclose a carrier amplifier and a peak amplifier in a common package, or to integrate a carrier amplifier and a peak amplifier within a common substrate. However, such densely disposed amplifiers, or amplifier elements, inevitably brings a subject how to suppress heat generation and how to secure heat dissipating path. When a semiconductor amplifying device integrating transistor elements is mounted on an assembly substrate 2 through bumps, a minimum distance between neighbor bumps becomes only several hundred micronmeters. While, an RF signal in a millimeter band, for instance 80 GHz, has a λ/4 wavelength of about 300 μm, which is comparable to the minimum distance between the bumps and restricts additional bumps to secure a heat dissipating paths. The semiconductor device 20 according to the embodiment of the present invention disposes the first transistor elements 12 for the carrier amplifier and the second transistor elements 13 for the peak amplifier alternatively on the common semiconductor substrate to suppress the temperature rise in the carrier amplifier.

The embodiment of the present invention disposes the first transistor elements 12 and the second transistor elements 13 alternatively along a direction perpendicular to a direction connecting the input terminal with the output terminals, which may not only equalize a total length of the second input line $23_2$ and the third output line $24_3$ for the first transistor elements 12 with a total length of the third input line $23_3$ and the second output line $24_2$ but also all input lines, $23_1$ to $23_3$, including the input terminal 21 form a rotational symmetry against all output lines, $24_1$ to $24_3$, including the output terminal 22 with respect to a point between the first transistor elements 12 disposed inner and the second transistor elements 13 also disposed inner.

At least one of the second input line $23_2$ and the third input line $23_3$ in a portion thereof, for instance the metal pattern $23_{3b}$ in the third input line $23_3$, may intersect the other of the second input line $23_2$ and the third input line $23_3$ by forming the portion (the metal pattern $23_{3b}$) in a metal layer different from the metal layer for the other input lines, $23_1$ to $23_3$. Also, at least one of the second output line $24_2$ and the third output line $24_3$ in a portion thereof, for instance the metal pattern $24_{2b}$ in the second output line $24_2$, may intersect the other of the second output line $24_2$ and the third output line $24_3$ by forming the portion (the metal pattern $24_{2b}$) in a metal layer difference from the metal layers for the output lines, $24_1$ to $24_3$. Such a wiring structure including the intersections in the input lines, $23_1$ to $23_3$, and the output lines, $24_1$ to $24_3$, may arrange the first transistor elements 12 and the second transistor elements alternatively and provide the input biases and the output biases independently to the first and second transistor elements, 12 and 13.

The embodiment according to the present invention may provide the ground layer 27 as the third metal layer $M_3$ between the second metal layer $M_2$ and the fourth metal layer $M_4$, where the fourth metal layer $M_4$ provides the portion (for instance the metal pattern $23_{3b}$) in at least one of the second input line $23_2$ and the third input line $23_3$; while, the second metal layer $M_2$ provides the rest of the second input line $23_2$ and the third input line $23_3$. The ground layer 27 may shows a function of a shield between the metal layers, $M_2$ and $M_4$, at the intersection. Similarly, the ground layer 27 as the third metal layer $M_3$ may be put between the fourth metal layer $M_4$ that provides the portion (for instance, the metal pattern $24_{2b}$) in at least one of the second output line $24_2$ and the third output line $24_3$ and the second metal layer $M_2$ that provides the other of the second output line $24_2$ and the third output line $24_3$. Thus, the ground layer 27 may show a function of shielding a signal carried in the third output line $24_3$ from a signal carried in the second output line $24_2$.

The first and second transistor elements, 12 and 13, may be disposed in an array along a direction perpendicular to a direction connecting the input terminal 21 with the output terminal 22. Specifically, the axis of the arrayed disposition of the transistor elements, 12 and 13, may be orthogonal to a direction connecting the sides where the input terminal 12 and the output terminal 13 are disposed. In an alternative, the transistor elements, 12 and 13, may be disposed in a zigzag pattern where the first transistor elements 12 are arrayed in a line closer to the side 20b where the input terminal 21 is provided, while, the second transistor elements 13 are arrayed in a line closer to the side 20c where the output terminal 22 is provided. That latter disposition may widen a distance against the neighbor transistor elements, which may decrease the density of the heat generation.

While particular embodiments of the present invention have been described herein for purposes of illustration, many modifications and changes will become apparent to those skilled in the art. For instance, the embodiments thus described implements two transistor elements 12 for the carrier amplifier and other two transistor elements 13 for the peak amplifier alternatively disposed to each other. However, a semiconductor device may three or more transistor elements for the carrier and peak amplifiers. Also, the embodiment provides the first and second transistor elements whose counts are same with each other. However, a semiconductor device may implement the first and second transistor elements with respective counts different from each other. Accordingly, the appended claims are intended to encompass all such modifications and changes as fall within the true spirit and scope of this invention.

What is claimed is:

1. A semiconductor device type of a Doherty amplifier that amplifies a radio frequency (RF) signal, the semiconductor device comprising:
   a plurality of first transistor elements collectively operating as a carrier amplifier of the Doherty amplifier, the carrier amplifier operating linearly with respect to the RF signal; and
   a plurality of second transistor elements collectively operating as a peak amplifier of the Doherty amplifier, the peak amplifier operating after the carrier amplifier saturates;
   wherein the first transistor elements and the second transistor elements are alternatively disposed on a semiconductor substrate,
   wherein each of the first transistor elements includes a pair of first source electrodes, a first drain electrode disposed between the first source electrodes, and a pair of first gate electrodes disposed between the respective first source electrodes and the first drain electrode,
   wherein each of the second transistor elements includes a pair of second source electrodes, a second drain electrode disposed between the second source electrodes, and a pair of second gate electrodes disposed between the respective second source electrodes and the second drain electrode, and
   wherein for at least one of the first transistor elements and at least one of the second transistor elements, one of the first source electrodes of the first transistor element and one of the second source electrodes of the second transistor element are commonly owned by the first transistor element and the second transistor element.

2. The semiconductor device according to claim 1,
   further including an input terminal and an output terminal provided on the semiconductor substrate,
   wherein the input terminal receives an RF signal and the output terminal outputs the RF signal amplified by the semiconductor device, and
   wherein the first transistor element and the second transistor element are arranged in an array along a direction intersecting a line connecting the input terminal with the output terminal.

3. The semiconductor device according to claim 1,
   further including an input terminal and an output terminal provided on the semiconductor substrate,
   wherein the input terminal receives an RF signal and the output terminal outputs the RF signal amplified by the semiconductor device, and
   wherein the first transistor element and the second transistor element are arranged in zigzag along a direction intersecting a line connecting the input terminal with the output terminal.

* * * * *